(12) United States Patent
Moon et al.

(10) Patent No.: US 7,886,436 B2
(45) Date of Patent: Feb. 15, 2011

(54) THIN FILM CAPACITOR-EMBEDDED PRINTED CIRCUIT BOARD AND METHOD OF MANUFACTURING THE SAME

(75) Inventors: Jin Seok Moon, Kyungki-do (KR); Yul Kyo Chung, Kyungki-do (KR); Soo Hyun Lyoo, Kyungki-do (KR); Seung Hyun Sohn, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 59 days.

(21) Appl. No.: 12/370,818

(22) Filed: Feb. 13, 2009

(65) Prior Publication Data

US 2009/0152121 A1 Jun. 18, 2009

Related U.S. Application Data

(62) Division of application No. 11/593,088, filed on Nov. 6, 2006, now Pat. No. 7,675,756.

(30) Foreign Application Priority Data

Nov. 7, 2005 (KR) .................. 10-2005-0105942

(51) Int. Cl.
*H05K 3/10* (2006.01)
(52) U.S. Cl. .................. 29/846; 29/25.03; 29/829; 29/832
(58) Field of Classification Search ............. 29/25.03, 29/829, 832, 846
See application file for complete search history.

(56) References Cited

U.S. PATENT DOCUMENTS 5,453,908 A * 9/1995 Tsu et al. .................. 361/321.5

(Continued)

FOREIGN PATENT DOCUMENTS

JP 04-285046 10/1992

(Continued)

OTHER PUBLICATIONS

Japanese Office Action issued in Japanese Patent Application No. 2006-301545, mailed Feb. 17, 2009.

*Primary Examiner*—A. Dexter Tugbang
*Assistant Examiner*—Azm Parvez
(74) *Attorney, Agent, or Firm*—McDermott Will & Emery LLP

(57) ABSTRACT

Disclosed herein is a printed circuit board with an embedded thin-film capacitor, and a method of manufacturing the same.

Specifically, the present invention relates to a printed circuit board with an embedded thin-film capacitor, comprising a lower electrode formed on an insulating substrate; an amorphous paraelectric film formed on the lower electrode; a metal seed layer formed on the paraelectric film; and an upper electrode formed on the metal seed layer and having a surface roughness (Ra) of more than 300 nm; and a method of manufacturing a printed circuit board with an embedded thin-film capacitor, comprising forming a lower electrode on an insulating substrate; forming an amorphous paraelectric film on the lower electrode, using a low-temperature film formation process; forming a metal seed layer on the paraelectric film; and forming an upper electrode having a surface roughness (Ra) of more than 300 nm on the metal seed layer, using an electroplating method.

11 Claims, 3 Drawing Sheets

U.S. PATENT DOCUMENTS

| | | |
|---|---|---|
| 6,184,044 B1 * | 2/2001 | Sone et al. ............... 438/3 |
| 6,402,304 B1 * | 6/2002 | Qiu et al. ............... 347/68 |
| 6,806,553 B2 * | 10/2004 | Yashima et al. ............... 257/532 |
| 6,818,469 B2 * | 11/2004 | Mori et al. ............... 438/52 |
| 6,900,498 B2 * | 5/2005 | Stauf et al. ............... 257/310 |
| 7,172,818 B2 * | 2/2007 | Nakaoka et al. ............... 428/553 |
| 7,349,198 B2 * | 3/2008 | Yano et al. ............... 361/524 |
| 7,541,626 B2 * | 6/2009 | Kim et al. ............... 257/213 |
| 2001/0006833 A1 * | 7/2001 | Lee et al. ............... 438/240 |
| 2006/0012279 A1 * | 1/2006 | Nanataki et al. ............... 313/310 |
| 2006/0022304 A1 * | 2/2006 | Rzeznik ............... 257/532 |
| 2006/0057420 A1 * | 3/2006 | Yokota et al. ............... 428/674 |
| 2006/0163725 A1 * | 7/2006 | Haba et al. ............... 257/737 |
| 2006/0234852 A1 | 10/2006 | Kim et al. |
| 2007/0085166 A1 * | 4/2007 | Moon et al. ............... 257/532 |
| 2007/0094871 A1 * | 5/2007 | Moon et al. ............... 29/832 |
| 2007/0177331 A1 * | 8/2007 | Das et al. ............... 361/306.1 |
| 2008/0110667 A1 * | 5/2008 | Ahn et al. ............... 174/257 |
| 2009/0026887 A1 * | 1/2009 | Fujii et al. ............... 310/330 |

FOREIGN PATENT DOCUMENTS

| | | |
|---|---|---|
| JP | 05-251258 | 9/1993 |
| JP | 06-162857 | 6/1994 |
| JP | 09-246720 | 9/1997 |
| JP | 11-214853 | 8/1999 |
| JP | 2000-252611 | 9/2000 |
| JP | 2001-223346 | 8/2001 |
| JP | 2005-045099 | 2/2005 |
| WO | WO 2004/040604 A1 | 5/2004 |

* cited by examiner

THIN FILM CAPACITOR-EMBEDDED PRINTED CIRCUIT BOARD AND METHOD OF MANUFACTURING THE SAME

RELATED APPLICATIONS

This application is a Divisional of U.S. Ser. No. 11/593,088, filed Nov. 6, 2006 now U.S. Pat. No. 7,675,756, claiming priority of Korean Patent Application No. 10-2005-0105942, filed Nov. 7, 2005, the entire contents of each of which are hereby incorporated by reference.

RELATED APPLICATIONS

The present application is based on, and claims priority from, Korean Application Number 2005-105942 filed on Nov. 7, 2005, the disclosure of which is incorporated by reference herein in its entirety.

BACKGROUND OF THE INVENTION

1. Field of the Invention

The present invention relates to a printed circuit board having an embedded thin-film capacitor, and a method of manufacturing the same. More specifically, the present invention relates to a printed circuit board having an embedded thin-film capacitor, which is capable of improving product reliability and reducing a product production cost by controlling the electrode surface roughness via formation of an upper electrode of a thin film capacitor using an electroplating method, and a method of manufacturing the same.

2. Description of the Related Art

Recently, an ongoing trend toward higher performance of electronic equipment has led to an increasing market demand for passive devices having a high-integration degree. However, various passive devices, which have been conventionally mounted and arranged on printed circuit boards (PCBs), are generally recognized as a significant obstacle against miniaturization of such electronic equipment. In particular, speeding trends toward the development of embedded systems of semiconductor active devices and increasing numbers of input/output terminals of the devices result in a need to secure the arrangement space for a higher number of passive devices disposed around active devices. However, it is not easy to solve such problems associated with securing of the arrangement space.

As typical examples of passive devices, there are capacitors. Such capacitors require an optimal disposition to decrease a high frequency-induced inductance as they seek higher frequency applications in an operating frequency thereof. For example, decoupling capacitors, which have been used for a stable supply of an electric power, require the disposition thereof in the closest proximity of the input terminal in order to reduce a high frequency-induced inductance.

In order to keep up with increasing demands for the downsizing and higher frequency applications of semiconductor devices including the decoupling capacitor, various types of multi-layer ceramic capacitors (MLCCs) having low equivalent series inductance (Low ESL) have been actively developed. Nonetheless, conventional MLCCs, which are discrete devices, have suffered from fundamental limitations and difficulties to overcome the above-mentioned problems. These capacitors are widely used as a device of an electric circuit. Therefore, if they can be embedded within electric circuit boards, it is possible to effectively reduce a required area of the circuit board. Recently, to investigate the feasibility of such an idea, a great deal of research and study has been actively focused on the development of an embedded capacitor.

The embedded capacitor is embedded in PCBs which have been used in memory cards, PC main boards and various RF modules, and therefore its application may lead to a remarkable reduction of a product size. Further, owing to a feasible disposition of the embedded capacitor in the proximity of the input terminal of the active device, it is advantageously possible to significantly reduce a high frequency-induced inductance by minimizing a length of a lead wire connected to the capacitor via such an optimal disposition of the embedded capacitor.

As an example of such an embedded capacitor, mention may be made of a patent invention disclosed in U.S. Pat. No. 6,818,469. According to this art, a printed circuit board 10 having a conventional thin-film capacitor embedded therein, as shown in FIG. 1, has suggested an embedded thin film capacitor including an insulating substrate 11a, a lower electrode 13 formed on the insulating substrate 11a, a dielectric thin film 15 formed on the lower electrode 13, and an upper electrode 17 formed on the dielectric thin film 15.

On the other hand, upon manufacturing of such a conventional thin film capacitor, the upper and lower electrodes of the capacitor are formed by application of a physical vapor deposition (PVD) method such as sputtering, e-beam evaporation or the like, which suffers from a difficulty to obtain a desired thickness of the electrode in terms of cost. Further, the electrode, formed through such a PVD method, typically has a surface roughness (Ra) of less than 100 nm. Hence, where the insulating substrate 11b such as a prepreg is pressure-deposited on the top of the upper electrode 17 during a subsequent process, the delamination 19 between the upper electrode 17 and the thus-deposited insulating substrate 11b may occur, which consequently makes it difficult to apply such a thin film capacitor to an organic circuit board.

Further, disadvantageously, such a conventional thin film capacitor disclosed in the above US patent cannot be applied to manufacturing of a printed circuit board (PCB) which is a polymer composite-based insulating substrate, because heat treatment at a temperature of 400° C. following the formation of the dielectric film is carried out so as to improve a dielectric constant.

SUMMARY OF THE INVENTION

Therefore, the present invention has been made in view of the above problems, and it is an object of the present invention to provide a printed circuit board with an embedded thin-film capacitor, which is capable of improving a product reliability via the formation of an amorphous paraelectric thin film having desired dielectric characteristics at a low temperature, simultaneously with the formation of a capacitor electrode using an electroplating method.

It is another object of the present invention to provide a method of manufacturing the above-mentioned printed circuit board.

In accordance with an aspect of the present invention, the above and other objects can be accomplished by the provision of a printed circuit board having an embedded thin-film capacitor, comprising:

a lower electrode formed on an insulating substrate;

an amorphous paraelectric film formed on the lower electrode;

a metal seed layer formed on the paraelectric film; and an upper electrode formed on the metal seed layer and having a surface roughness (Ra) of more than 300 nm.

In accordance with another aspect of the present invention, there is provided a method of manufacturing a printed circuit board having an embedded thin-film capacitor, comprising:

forming a lower electrode on an insulating substrate;

forming an amorphous paraelectric film on the lower electrode, using a low-temperature film formation process;

forming a metal seed layer on the paraelectric film; and forming an upper electrode having a surface roughness (Ra) of more than 300 nm on the metal seed layer, using an electroplating method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, the present invention will be described in more detail with reference to the accompanying drawings.

First, a printed circuit board 20 having an embedded thin-film capacitor according to the present invention will be described.

Figure 1:
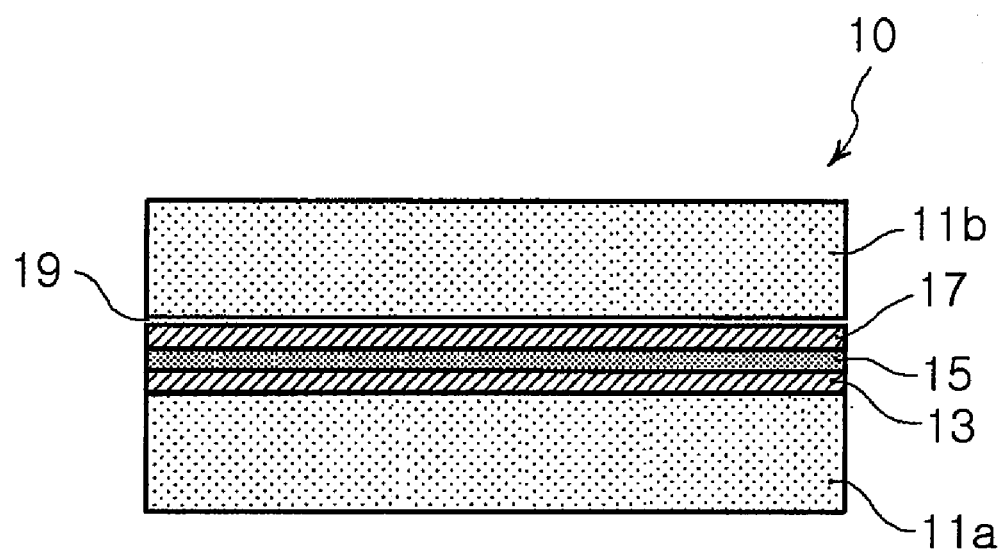
FIG. 1 is a cross-sectional view showing a printed circuit board having an embedded thin-film capacitor according to a conventional art.
Figure 2:
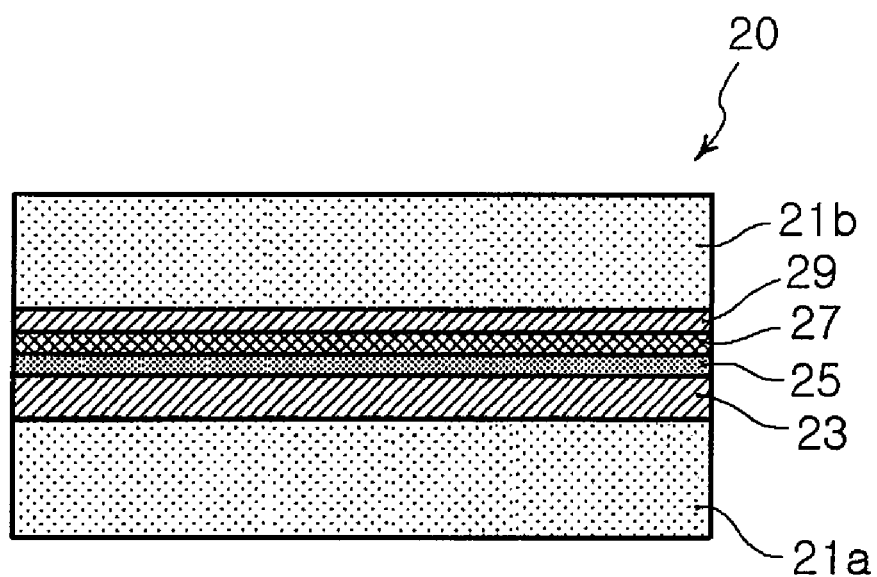
FIG. 2 is a cross-sectional view showing a printed circuit board having an embedded thin film capacitor according to one embodiment of the present invention.

FIG. 2 is a cross-sectional view of a printed circuit board having an embedded thin-film capacitor according to one embodiment of the present invention. As shown in FIG. 2, the printed circuit board 20 of the present invention has a structure including a lower electrode 23, an amorphous paraelectric film 25, a metal seed layer 27 and an upper electrode 29, which are sequentially stacked on an insulating substrate 21a.

Preferably, the upper electrode 29 is formed to have a surface roughness (Ra) of more than 300 nm. Therefore, upon pressure-deposition of an insulating substrate 21b on the upper electrode 29 to complete a circuit board, it is possible to effectively prevent the delamination between the upper electrode 29 and the deposited insulating substrate 21b.

A material for the insulating substrates 21a and 21b used in the present invention may be a polyimide or epoxy resin which has been widely used in manufacturing of printed circuit boards.

Further, the amorphous paraelectric film 25 is preferably composed of a BiZnNb-based amorphous metal oxide and more preferably a metal oxide of Formula $Bi_xZn_yNb_zO_7$ wherein $1.3<x<2.0$, $0.8<y<1.5$ and $z<1.6$.

Alternatively, the amorphous paraelectric film of the present invention may be preferably formed of an oxide of Formula $Bi_x(M'_yM_z")O_7$ wherein $1.3<x<2.0$, $0.8<y<1.5$, $z<1.6$, M'=Zn, Mg, Ni, Sc, In or Cu, and M"=Nb or Ta); an oxide of Formula $Bi_xZn_yNb_zZr_\alpha O_7$ wherein $1.3<x<2.0$, $y<1.0$, $z<1.5$ and $\alpha<2.0$; an oxide of Formula $Bi_xZn_yNb_zTi_\alpha O_7$ wherein $1.3<x<2.0$, $y<1.0$, $z<1.5$ and $\alpha<2.0$; an oxide of Formula $Bi_xZn_yNb_zGd_\alpha O_7$ wherein $1.3<x<2.0$, $y<1.0$, $z<1.5$ and $\alpha<2.0$; or an oxide of Formula $Bi_xNb_yO_4$ wherein $1.3<x<2.0$ and $y<1.0$.

More preferably, the dielectric film is formed to have a thickness of less than 2.0 μm.

The upper and lower electrodes 23 and 29 are preferably composed of one metal selected from the group consisting of Cu, Ni, Al, Pt, Ta and Ag. More preferably, Cu is used as the material for the upper and lower electrodes. Further, each electrode is preferably formed to have a thickness of less than 2.0 μm.

The metal seed layer 27 is preferably composed of one metal selected from the group consisting of Cu, Ni, Ti, Au, Pt and Pd and is more preferably formed to have a thickness of 3 to 500 nm.

In specified embodiment, the surface roughness (Ra) of the lower electrode 23 may be below 250 nm.

Hereinafter, a manufacturing process of the thin film capacitor-embedded printed circuit board according to the present invention will be illustrated.

Figure 3:
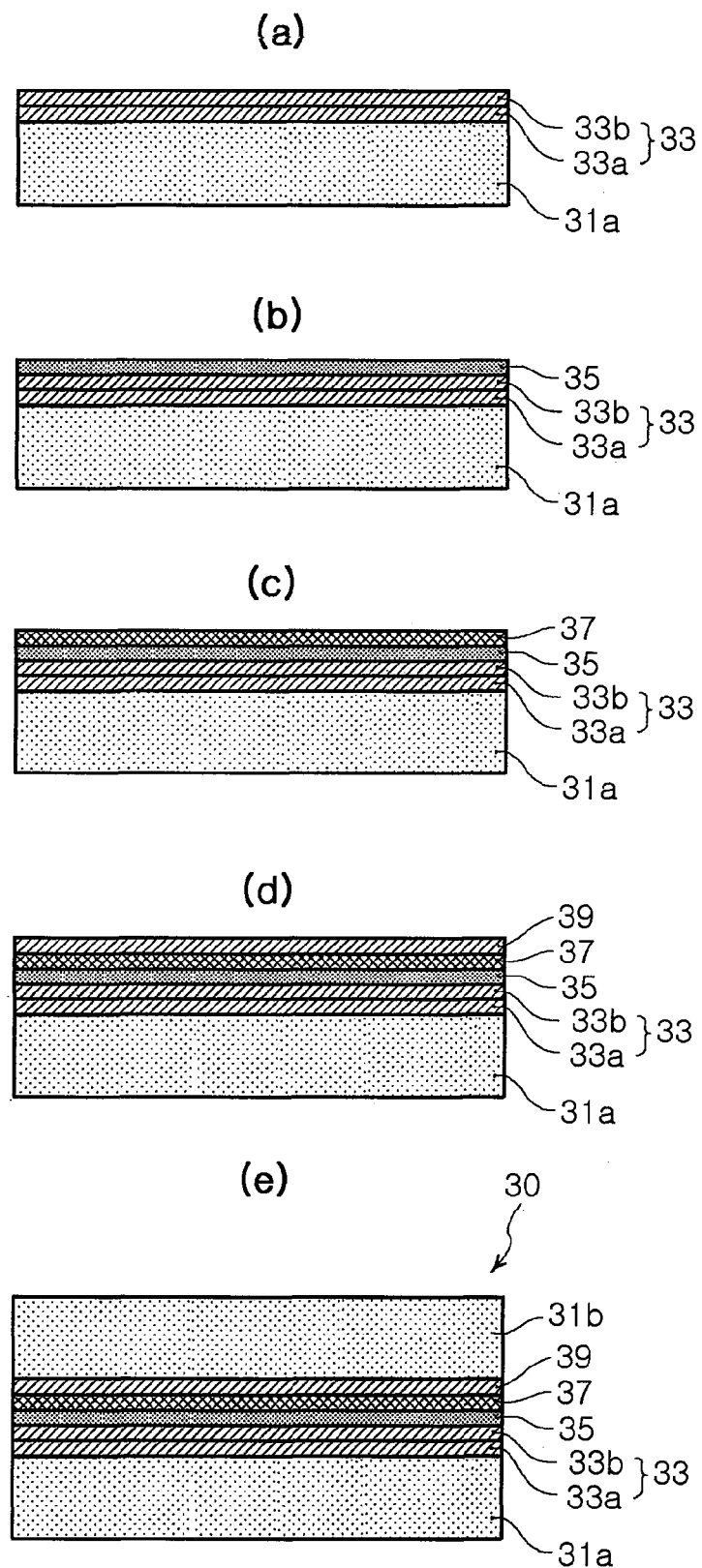
FIG. 3 is a process cross-sectional view illustrating a manufacturing process of a printed circuit board according to the present invention.

FIG. 3 is a process cross-sectional view illustrating a manufacturing process of a printed circuit board according to the present invention. As shown in FIG. 3a, a lower electrode 33 is first formed on an insulating substrate 31a. Upon taking into consideration that the insulating substrate 31a is made of a thermally-labile polymer material, the lower electrode 33 is preferably formed by using a low-temperature film formation process such as low-temperature sputtering, evaporation or electroless plating.

Preferably, the electroless plating is carried out on the insulating substrate 31a and the electroplating is followed to form the lower electrode 33. Herein, the thickness of the lower electrode 33 is preferably limited to less than 2.0 μm. More preferably, an electroless plating part 33a and an electroplating part 33b of the lower electrode 33 are respectively limited to have a thickness of less than 1.0 μm.

Preferably, the lower electrode 33 is composed of one metal selected from the group consisting of Cu, Ni, Al, Pt, Ta and Ag. More preferably, the lower electrode 33 is formed of Cu.

A material for the insulating substrates 31a and 31b used in the present invention may be a polyimide or epoxy resin which has been conventionally used in manufacturing of printed circuit boards.

Next, as shown in FIG. 3b, an amorphous paraelectric film 35 is formed on the lower electrode 33 formed as above. The paraelectric film 35 is preferably formed by using a low-temperature film formation process at a temperature of less than 200° C. Examples of the low-temperature film formation process may include sputtering, pulsed laser deposition (PLD), and chemical vapor deposition (CVD) utilizing various metal sources. The dielectric film 35, obtained by the low-temperature film formation process, is made of an amorphous metal oxide and exhibits a sufficient dielectric constant, thus requiring no high-temperature heat treatment process for crystallization.

The amorphous paraelectric film 35 is preferably composed of a BiZnNb-based amorphous metal oxide and more preferably a metal oxide of Formula $Bi_xZn_yNb_zO_7$ wherein $1.3<x<2.0$, $0.8<y<1.5$ and $z<1.6$. The dielectric film composed of such an amorphous oxide may have a high dielectric constant of more than 30, and further, more than 40 via a low-temperature heat treatment.

More preferably, the dielectric film is formed to have a thickness of less than 2.0 μm.

Thereafter, as shown in FIG. 3c, a metal seed layer 37 is formed on the amorphous paraelectric film 35 formed as above.

The metal seed layer 37 is formed by using a physical vapor deposition (PVD) method such as sputtering, e-beam evaporation or the like.

More preferably, the metal seed layer 37 is formed of one metal selected from the group consisting of Cu, Ni, Ti, Au, Pt and Pd. Further, the metal seed layer 37 desirably has a thickness of 3 to 500 nm.

Next, as shown in FIG. 3d, an outer electrode 39 is formed on the metal seed layer 37. The outer electrode 39 is required to be formed via an electroplating process, such that the electrode has a surface roughness (Ra) of more than 300 nm. In order to form the upper electrode having such a surface roughness range, it is desirable to optimize a current density and a plating time, upon electroplating.

Preferably, the electroplating of the upper electrode employs a plating solution containing less than 200 g/L of $CuSO_4.5H_2O$, 30 to 200 g/L of $H_2SO_4$, less than 100 ppm of $Cl^-$, less than 20 mL/L of a leveler and less than 1.0 mL/L of a brightener.

More preferably, the electroplating process is carried out at a current density of 1.0 to 3.0 ampere/dm$^2$ and a plating time of less than 20 min.

Further, the upper electrode 39 is preferably formed by electroplating of one metal selected from the group consisting of Cu, Ni, Al, Pt, Ta and Ag. More preferably, Cu is used as the material for the upper electrode 39.

Next, as shown in FIG. 3e, an insulating substrate 31b is deposited on the upper electrode 39, and the resulting stack structure is compressed using a conventional process, thereby manufacturing a printed circuit board having a thin film capacitor embedded therein.

Herein, by manufacturing a printed circuit board via pressure-deposition of the insulating substrate 31b on the upper electrode 39 having a surface roughness (Ra) of more than 300 nm, it is possible to effectively prevent the delamination 19 between the upper electrode and insulating substrate, which has suffered by a process utilizing the upper electrode via a conventional PVD method or the like.

As discussed hereinbefore, by the sequential formation of the thin film capacitor on the insulating substrate, the present invention can effectively manufacture a thin film capacitor-embedded printed circuit board via a conventional manufacturing process of a build-up printed circuit board.

Further, the present invention can also improve the product reliability, via effective prevention of the delamination between the upper electrode and insulating substrate, which has suffered by the manufacturing process of a printed circuit board having a conventional thin-film capacitor embedded therein.

EXAMPLES

Now, the present invention will be described in more detail with reference to the following examples. These examples are provided only for illustrating the present invention and should not be construed as limiting the scope and spirit of the present invention.

Example 1

Lower electrodes having a thickness of less than 2.0 μm were formed by performing electroless-copper plating and electro-copper plating on a plurality of substrates made of ABF SH9K. Then, BZN ($Bi_{1.5}Zn_1Nb_{1.5}O_7$) paraelectric films were deposited on the thus-formed lower electrodes, using a sputtering method. Deposition was carried out at a temperature of less than 200° C. and pressure of less than 200 mTorr for less than 3 hours. The thus-deposited dielectric films had a thickness of about 300 nm.

Copper (Cu) metal seed layers were formed on the resulting dielectric films, using a sputtering method. Thereafter, upper electrodes were formed on the metal seed layers, using a conventional electro-copper plating process. Formation of the upper electrode via the electro-copper plating process employed a plating solution containing 200 g/L of $CuSO_4.5H_2O$, 30 g/L of $H_2SO_4$, less than 40 ppm of $Cl^-$, 20 mL/L of a leveler and 0.5 mL/L of a brightener. The electroplating process is carried out at a current density of 1.5 ampere/dm$^2$ and a plating time of less than 4 min.

On the other hand, using a sputtering method as in conventional arts, lower electrodes, dielectric films, and upper electrodes having a thickness of about 1.0 μm were respectively formed on a plurality of substrates made of ABF SH9K.

Thereafter, a surface roughness (Ra) of the-thus formed upper electrodes was measured. The results thus obtained are given in Table 1 below.

TABLE 1

| Sample No. | Inventive (nm) | Conventional (PVD method) (nm) |
|---|---|---|
| 1 | 300 | 101 |
| 2 | 306 | 123 |
| 3 | 295 | 125 |
| 4 | 305 | 116 |
| 5 | 301 | 116 |
| Average | 301 | 116 |

From the results given in Table 1, it can be seen that all of the thin-film capacitors manufactured according to the method of the present invention exhibited an upper electrode surface roughness (Ra) of about 300 nm, which is significantly higher than that of conventional examples manufacturing the upper electrode via the PVD method.

Figure 4:
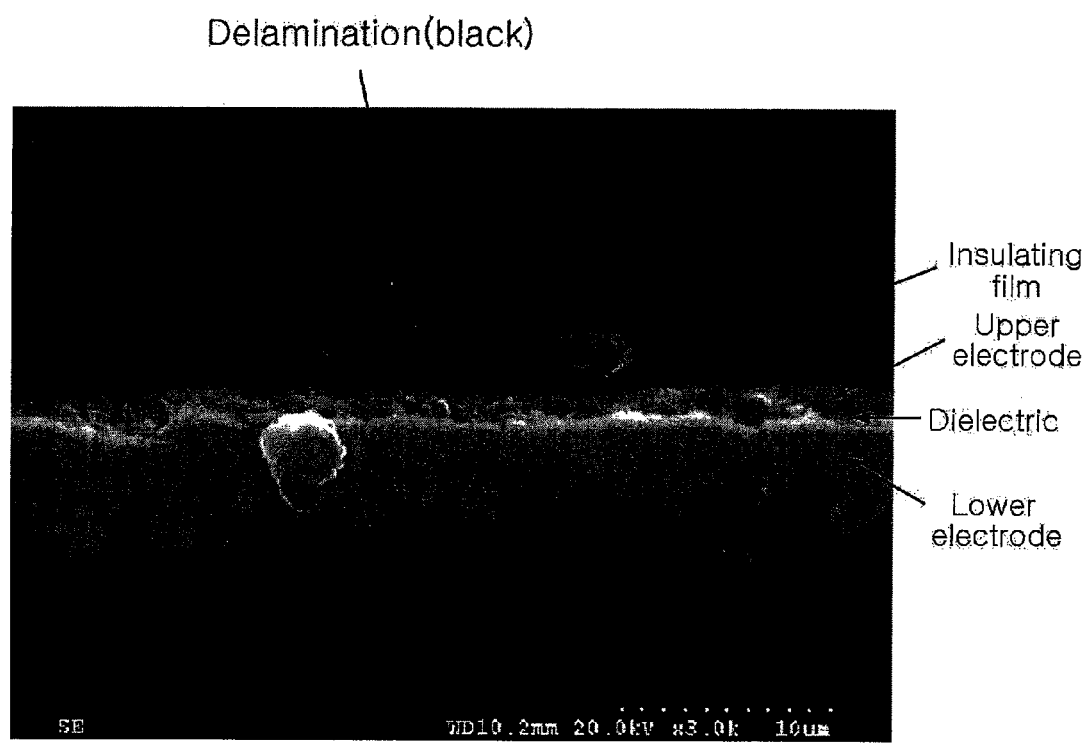
FIG. 4 is a photograph showing the delamination between an upper electrode and an insulating substrate, occurring upon manufacture of a capacitor-embedded printed circuit board according to a conventional art.

In addition, when a printed circuit board having an embedded thin-film capacitor is finally manufactured by depositing an insulating material, ABF SH9K, on the thus-formed outer electrode, it can be seen that the present invention can provide effective prevention of the delamination between the upper electrode and insulating substrate, owing to a high surface roughness of the upper electrode, whereas a conventional art suffers from the delamination between the upper electrode and insulating substrate, as shown in FIG. 4.

As discussed hereinbefore, the present invention enables production of a thin film capacitor-embedded printed circuit board via a conventional build-up process and consequently a reduction of manufacturing process costs. Further, according to the present invention, it is possible to ensure high-reliability products, via effective prevention of the delamination between the upper electrode and insulating substrate, which has suffered by the build-up process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board having an embedded thin-film capacitor, comprising:

forming a lower electrode on a first insulating substrate;

forming an amorphous paraelectric film on the lower electrode, using a low-temperature film formation process;

forming a metal seed layer on the paraelectric film;

forming an upper electrode having a surface roughness (Ra) of more than 300 nm on the metal seed layer, using an electroplating method; and forming a second insulating substrate on the upper electrode by pressure-deposition.

2. The method according to claim 1, wherein the lower and upper electrodes are each formed of one metal selected from the group consisting of Cu, Ni, Al, Pt, Ta and Ag.

3. The method according to claim 1, wherein the upper electrode is formed by electro-copper plating, using a plating solution containing less than 200 g/L of $CuSO_4 \cdot 5H_2O$, 30 to 200 g/L of $H_2SO_4$, less than 100 ppm of $Cl^-$, less than 20 mL/L of a leveler and less than 1.0 mL/L of a brightener.

4. The method according to claim 3, wherein the electroplating of the upper electrode is carried out at a current density of 1.0 to 3.0 ampere/$dm^2$ and a plating time of less than 20 min.

5. The method according to claim 1, wherein the lower electrode is formed by performing electroless plating, followed by electroplating.

6. The method according to claim 1, wherein the amorphous paraelectric film is a dielectric film of a BiZnNb-based metal oxide.

7. The method according to claim 6, wherein the BiZnNb-based metal oxide is a metal oxide of Formula $Bi_xZn_yNb_zO_7$ wherein $1.3<x<2.0$, $0.8<y<1.5$ and $z<1.6$.

8. The method according to claim 1, wherein the amorphous paraelectric film is formed by using a low-temperature film formation process at a temperature of less than 200° C.

9. The method according to claim 1, wherein the metal seed layer is formed of one metal selected from the group consisting of Cu, Ni, Ti, Au, Pt and Pd.

10. The method according to claim 1, wherein the metal seed layer is formed by using a physical vapor deposition (PVD) method.

11. The method according to claim 1, wherein the amorphous paraelectric film is composed of one oxide selected from the group consisting of an oxide of Formula $Bi_x(M'_yM_z'')O_7$ wherein $1.3<x<2.0$, $0.8<y<1.5$, $z<1.6$, M'=Zn, Mg, Ni, Sc, In or Cu, and M''=Nb or Ta); an oxide of Formula $Bi_xZn_yNb_zZr_\alpha O_7$ wherein $1.3<x<2.0$, $y<1.0$, $z<1.5$ and $\alpha<2.0$; an oxide of Formula $Bi_xZn_yNb_zTi_\alpha O_7$ wherein $1.3<x<2.0$, $y<1.0$, $z<1.5$, and $\alpha<2.0$; an oxide of Formula $Bi_xZn_yNb_zGd_\alpha O_7$ wherein $1.3<x<2.0$, $y<1.0$, $z<1.5$ and $\alpha<2.0$; or an oxide of Formula $Bi_xNb_yO_4$ wherein $1.3<x<2.0$ and $y<1.0$.

* * * * *